US010211044B2

(12) United States Patent
Horikiri et al.

(10) Patent No.: US 10,211,044 B2
(45) Date of Patent: Feb. 19, 2019

(54) METHOD FOR MANUFACTURING FERROELECTRIC THIN FILM DEVICE

(71) Applicant: SUMITOMO CHEMICAL COMPANY, LIMITED, Tokyo (JP)

(72) Inventors: Fumimasa Horikiri, Hitachi (JP); Kenji Shibata, Hitachi (JP); Kazutoshi Watanabe, Hitachi (JP); Kazufumi Suenaga, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 15/561,360

(22) PCT Filed: Mar. 2, 2016

(86) PCT No.: PCT/JP2016/056447
§ 371 (c)(1),
(2) Date: Sep. 25, 2017

(87) PCT Pub. No.: WO2016/152423
PCT Pub. Date: Sep. 29, 2016

(65) Prior Publication Data
US 2018/0082839 A1 Mar. 22, 2018

(30) Foreign Application Priority Data

Mar. 26, 2015 (JP) .................. 2015-064739

(51) Int. Cl.
H01L 21/02 (2006.01)
H01L 21/311 (2006.01)
(Continued)

(52) U.S. Cl.
CPC .. *H01L 21/02197* (2013.01); *H01L 21/02266* (2013.01); *H01L 21/31111* (2013.01);
(Continued)

(58) Field of Classification Search
None
See application file for complete search history.

(56) References Cited

U.S. PATENT DOCUMENTS 6,347,862 B1 2/2002 Kanno et al.
2002/0003123 A1 1/2002 Lee et al.
(Continued)

FOREIGN PATENT DOCUMENTS

EP 2 843 723 A1 3/2015
JP 10-286953 A 10/1998
(Continued)

OTHER PUBLICATIONS

International Search Report (Form PCT/ISA/210) for International Application No. PCT/JP2016/056420, dated May 24, 2016.
(Continued)

Primary Examiner — Khaja Ahmad
(74) Attorney, Agent, or Firm — Birch, Stewart, Kolasch & Birch, LLP

(57) ABSTRACT

This method for manufacturing a ferroelectric thin film device includes: a lower electrode film formation step of forming a lower electrode film on a substrate; a ferroelectric thin film formation step of forming a ferroelectric thin film made of a sodium potassium niobate on the lower electrode film; an upper electrode film formation step of forming an upper electrode film on the ferroelectric thin film; and an upper electrode film etching step of shaping the upper electrode film into a desired micro-pattern by performing a reactive ion etching process on the upper electrode film. The upper electrode film etching step is a step of calculating a rate of change of sodium emission intensity in an ion plasma generated by the reactive ion etching process and determining that the etching process is completed when the rate of change falls below a predetermined threshold.

8 Claims, 4 Drawing Sheets

(51) Int. Cl.
- *H01L 21/66* (2006.01)
- *H01L 21/78* (2006.01)
- *H01L 37/02* (2006.01)
- *H01L 41/187* (2006.01)
- *H01L 41/29* (2013.01)
- *H01L 49/02* (2006.01)
- *H01L 41/332* (2013.01)
- *H01L 21/3213* (2006.01)
- *H01L 27/11507* (2017.01)
- *H01L 41/314* (2013.01)
- *H01L 41/047* (2006.01)

(52) U.S. Cl.
CPC ........ *H01L 21/32136* (2013.01); *H01L 21/78* (2013.01); *H01L 22/26* (2013.01); *H01L 27/11507* (2013.01); *H01L 28/55* (2013.01); *H01L 28/65* (2013.01); *H01L 37/025* (2013.01); *H01L 41/187* (2013.01); *H01L 41/1873* (2013.01); *H01L 41/29* (2013.01); *H01L 41/314* (2013.01); *H01L 41/332* (2013.01); *H01L 21/32139* (2013.01); *H01L 28/60* (2013.01); *H01L 41/0477* (2013.01)

(56) References Cited

U.S. PATENT DOCUMENTS

| | | |
|---|---|---|
| 2007/0103038 A1 | 5/2007 | Kamijo |
| 2008/0284543 A1* | 11/2008 | Taniguchi ............ H03H 9/0211 333/187 |
| 2010/0320871 A1 | 12/2010 | Suenaga et al. |
| 2011/0074251 A1* | 3/2011 | Shibata ............... H01L 41/1873 310/360 |
| 2011/0079883 A1* | 4/2011 | Shimada ............. H01L 41/0805 257/627 |
| 2011/0261120 A1 | 10/2011 | Shimizu et al. |
| 2012/0025667 A1 | 2/2012 | Horikiri et al. |
| 2012/0056508 A1* | 3/2012 | Horikiri ............. H01L 41/0805 310/317 |
| 2012/0236081 A1 | 9/2012 | Nakayama et al. |
| 2012/0304429 A1* | 12/2012 | Horikiri ............. H01L 41/0815 29/25.35 |
| 2013/0038176 A1 | 2/2013 | Horikiri et al. |
| 2014/0076842 A1* | 3/2014 | Takahashi ............... H01L 41/29 216/13 |
| 2014/0284302 A1 | 9/2014 | Hahiro |
| 2014/0322523 A1 | 10/2014 | Abbott, Jr. et al. |
| 2014/0339962 A1 | 11/2014 | Furukawa et al. |
| 2015/0229290 A1* | 8/2015 | Suenaga ................ H03H 9/171 310/321 |
| 2015/0380637 A1 | 12/2015 | Jiang et al. |
| 2016/0027996 A1 | 1/2016 | Fujii et al. |
| 2018/0114896 A1 | 4/2018 | Horikiri et al. |

FOREIGN PATENT DOCUMENTS

| | | |
|---|---|---|
| JP | 2000-31133 A | 1/2000 |
| JP | 2005-142911 A | 6/2005 |
| JP | 2007-019302 A | 1/2007 |
| JP | 2011-192736 A | 9/2011 |
| JP | 2011-235501 A | 11/2011 |
| JP | 2012-033693 A | 2/2012 |
| JP | 2012-059760 A | 3/2012 |
| JP | 2012-059851 A | 3/2012 |
| JP | 2012-059852 A | 3/2012 |
| JP | 2013-016776 A | 1/2013 |
| JP | 2013-38322 A | 2/2013 |
| JP | 2013-102089 A | 5/2013 |
| JP | 2013-225608 A | 10/2013 |
| JP | 2014-56988 A | 3/2014 |
| JP | 2014-60267 A | 4/2014 |
| JP | 2014-184643 A | 10/2014 |
| JP | 2014-187094 A | 10/2014 |
| JP | 2014-203839 A | 10/2014 |
| JP | 2014-207393 A | 10/2014 |
| JP | 2015-24663 A | 2/2015 |
| JP | 2015-53417 A | 3/2015 |
| WO | WO 2014/162998 A1 | 10/2014 |

OTHER PUBLICATIONS

International Search Report (Form PCT/ISA/210) for International Application No. PCT/JP2016/056430, dated May 24, 2016.
International Search Report (PCT/ISA/210) for International Application No. PCT/JP2016/056452, dated May 31, 2016.
Minh et al., "A New Lead-Free (K,Na)Nb03 Piezoelectric Material and Its Microfabrication for Micro Energy Harvester", PowerMEMS 2011, Proceedings Power MEMS, Nov. 15, 2011, pp. 237-240 (4 pages total).
International Search Report for PCT/JP2016/056447 (PCT/ISA/210) dated May 17, 2016.
European Patent Office Communication and extended search report issued in the European Patent Application No. 16746410.6 dated Aug. 30, 2018.
European Patent Office Communication and extended search report issued in the European Patent Application No. 16768322.6 dated Aug. 24, 2018.
European Patent Office Communication and extended search report issued in the European Patent Application No. 16768324.2 dated Aug. 24, 2018.
European Patent Office Communication and extended search report issued in the European Patent Application No. 16768627.8 dated Aug. 27, 2018.
Horikiri et al., "The Wet Etching Technique of KNN films by EDTA," The 61st JSAP Spring Meeting 2014, Mar. 3, 2014, p. 06-010.
European Patent Office Communication and extended search report issued in the European Patent Application No. 16772062.2 dated Oct. 1, 2018.
Extended European Search Report dated Oct. 1, 2018 for Application No. 16768326.7.

* cited by examiner

METHOD FOR MANUFACTURING FERROELECTRIC THIN FILM DEVICE

TECHNICAL FIELD OF THE INVENTION

The present invention relates to technologies regarding ferroelectric thin film devices and particularly to methods for manufacturing lead-free niobate-system ferroelectric thin film devices.

DESCRIPTION OF BACKGROUND ART

Ferroelectrics are very attractive substances because of their peculiar characteristics (such as very high relative permittivity, and good pyroelectric, piezoelectric and ferroelectric properties). So, various devices (such as ceramic multilayer capacitors, pyroelectric devices, piezoelectric devices and ferroelectric memories) have been developed and put into use utilizing such peculiar properties. Typical ferroelectrics are perovskite materials such as barium titanate ($BaTiO_3$) and lead zirconate titanate ($Pb(Zr_{1-x}Ti_x)O_3$, PZT). Of these, lead zirconate titanates (PZTs) provide relatively excellent polarization and piezoelectric properties and are therefore most widely used.

Lead-containing PZTs are specified hazardous substances. However, because there are currently no suitable commercially available alternative pyroelectric or piezoelectric materials, PZTs are exempt from the RoHS directive (the directive on the restriction of the use of specified hazardous substances in electrical and electronic equipment enforced by the European Union and Council of Europe). However, with the growing worldwide responsibility towards global environment conservation, a strong demand exists for development of pyroelectric and piezoelectric devices using lead-free ferroelectric materials.

Also, with the recent trend toward smaller and lighter electronic devices, there is an increasing need for ferroelectric thin film devices in which a thin-film technology is utilized.

Herein, pyroelectric and piezoelectric thin film devices will be described below as representatives of such ferroelectric thin film devices. Piezoelectric devices utilize the piezoelectric effect of a ferroelectric material, and are widely used as functional devices such as actuators and stress sensors. Actuators generate a displacement or vibration in response to an applied voltage to a ferroelectric (piezoelectric) material. Stress sensors generate a voltage in response to a strain produced in a piezoelectric material. Pyroelectric devices detect light (including infrared light) utilizing the pyroelectric effect of a ferroelectric material, and are widely used as infrared human body sensors, etc.

Examples of piezoelectric devices utilizing a lead-free piezoelectric material are described below. Patent Literature 1 discloses a piezoelectric thin film device including, on a substrate, a lower electrode, a piezoelectric thin film and an upper electrode. The piezoelectric thin film is made of an alkali niobate-based perovskite dielectric material of a chemical formula ($Na_xK_yLi_z$)$NbO_3$ (where 0<x<1, 0<y<1, 0≤z<1, and x+y+z=1). A buffer layer of a perovskite crystal structure material is formed between the piezoelectric thin film and the lower electrode. The perovskite buffer layer is highly preferentially (001), (100), (010) or (111) oriented. According to this Patent Literature 1, the piezoelectric thin film device utilizing the lead-free lithium potassium sodium niobate thin film exhibits sufficient piezoelectric properties.

Piezoelectric devices have a basic structure of a piezoelectric material sandwiched between two electrodes and are micro-fabricated into a beam shape or a tuning fork shape depending on their application. So, micro fabrication processes are important in order to put piezoelectric devices using lead-free piezoelectric materials to practical use.

Patent Literature 2 discloses a method of processing a wafer having thereon a piezoelectric thin film of a chemical formula ($K_{1-x}Na_x$)$NbO_3$ (where 0.4≤x≤0.7). The method includes the first step of ion etching the piezoelectric thin film on wafer in an Ar gas atmosphere and the second step of reactive ion etching the resulting wafer in a fluorine based reactive gas/Ar mixture atmosphere. According to this Patent Literature 2, a fine pattern of the piezoelectric thin film can be formed, thereby providing a highly reliable and low cost piezoelectric thin film device.

CITATION LIST

Patent Literature

Patent Literature 1: JP 2007-019302 A
Patent Literature 2: JP 2012-033693 A

SUMMARY OF THE INVENTION

Problems to be Solved By The Invention

As described above, niobate-based ferroelectric materials (such as potassium sodium niobate, typical chemical formula: ($K_{1-x}Na_x$)$NbO_3$) are very promising as lead-free ferroelectric materials. In order to put thin film devices using niobate-based ferroelectric materials as alternatives for PZTs to practical use and mass production, it is very important to develop and establish techniques for micro fabricating/fine processing niobate-based ferroelectric thin film devices with a high dimensional accuracy and at low cost.

However, since niobate-system ferroelectric thin film devices are relatively new, their microfabrication processes are still in the stage of trial and error. In a typical ferroelectric thin film device, the ferroelectric thin film that forms the basis of the device functions is small in absolute volume yet large in surface area. It unfortunately means that any damage caused by a microfabrication process to part of the surface of the ferroelectric thin film would severely affect the ferroelectricity of the entire device. For example, in the case of finely shaping an upper electrode layer laminated on the surface of a ferroelectric thin film using a conventional dry etching technique, the portion of the ferroelectric thin film to be left to remain could be damaged due to overetching, resulting in a deteriorated ferroelectricity.

In view of the foregoing, it is an objective of the present invention to provide a method for manufacturing a thin film device including a lead-free niobate-system ferroelectric without deteriorating the ferroelectricity of the ferroelectric while permitting highly accurate and efficient fine shaping of an upper electrode film laminated on the surface of a ferroelectric thin film.

Solution to Problems

According to one aspect of the present invention, a method for manufacturing a ferroelectric thin film device includes: a lower electrode film formation step of forming a lower electrode film on a substrate; a ferroelectric thin film formation step of forming a ferroelectric thin film made of a sodium potassium niobate (typical chemical formula of ($K_{1-x}Na_x$)$NbO_3$, 0.4≤x≤0.7) on the lower electrode film; an upper electrode film formation step of forming an upper electrode film on the ferroelectric thin film; and an upper electrode film etching step of shaping the upper electrode film into a desired micro-pattern by performing a reactive ion etching process on the upper electrode film. The upper electrode film etching step is a step of calculating a rate of change of sodium emission intensity in an ion plasma generated by the reactive ion etching process and determining that the etching process is completed when the rate of change falls below a predetermined threshold.

In the above aspect of the invention, the following modifications and changes can be made.

(i) The predetermined threshold may be 1.0 after the rate of change of sodium emission intensity exceeds 1.01 once.

(ii) The rate of change of sodium (Na) emission intensity may be an average rate of change during a period of 0.5 seconds or more and 2 seconds or less.

(iii) The sodium emission may be a sodium emission spectrum having a wavelength of 586 nm or more and 592 nm or less.

(iv) In the reactive ion etching process, argon (Ar) may be used alone or in combination with a fluorine-based reaction gas as a process gas.

(v) The upper electrode film may comprise one selected from platinum (Pt), palladium (Pd), ruthenium (Ru), rhodium (Rh), iridium (Ir), gold (Au), and aluminum (Al).

(vi) The method may further include a dicing step of cutting out a chip-shaped ferroelectric thin film device from the substrate provided with the ferroelectric thin film having the upper electrode film formed on the ferroelectric thin film.

(vii) The method may further include a ferroelectric thin film etching step of shaping the ferroelectric thin film into a desired micro-pattern by performing an etching process on the ferroelectric thin film.

(viii) The ferroelectric thin film may have a pseudo cubic system or a tetragonal system and be formed by sputtering such that the film has a main surface with a (001) crystal plane preferential orientation.

(ix) The substrate may be a silicon substrate having a thermally oxidized film on its surface.

Advantages of the Invention

According to the present invention, is possible to provide a method for manufacturing a thin film device including a lead-free niobate-system ferroelectric without deteriorating the ferroelectricity of the ferroelectric while permitting highly accurate and efficient fine shaping of an upper electrode film laminated on the surface of a ferroelectric thin film.

DETAILED DESCRIPTION OF THE PREFERRED EMBODIMENTS

Figure 1A:
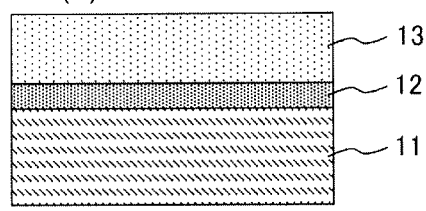
FIGS. 1(a)-1(f) are a schematic illustration showing an enlarged cross sectional view of manufacturing steps of a ferroelectric thin film device according to the present invention.
Figure 1B:
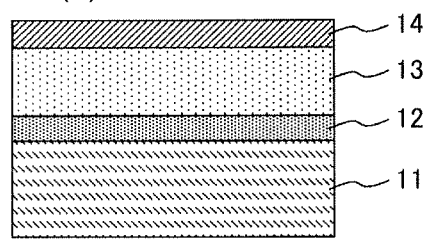
Figure 1C:
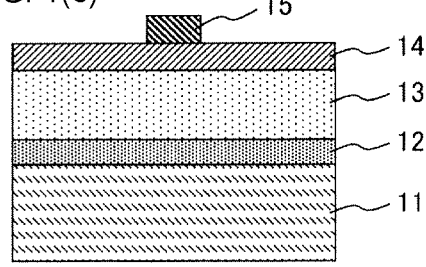
Figure 1D:
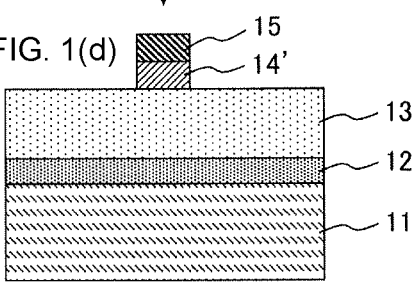

The present inventors have focused on a sodium potassium niobate (typical chemical formula of $(K_{1-x}Na_x)NbO_3$, $0.4 \leq x \leq 0.7$, hereinafter referred to as KNN) as a lead-free ferroelectric material that can be expected to exhibit a ferroelectricity comparable to that of PZT ($Pb(Zr_{1-x}Ti_x)O_3$) and conducted research and development with an aim to put KNN thin film devices into practical use. As mentioned above, since the ferroelectric thin film that works the basis of functions of the thin film device is small in absolute volume yet large in surface area, any damage caused by a microfabrication process to part of the surface of the ferroelectric thin film would severely affect the ferroelectricity of the entire device. In particular, in the case of fine shaping an upper electrode layer laminated on the surface of a ferroelectric thin film using a conventional dry etching technique, the portion of the ferroelectric thin film to be left to remain could be damaged due to overetching, resulting in a deteriorated ferroelectricity.

As a result of intensive research on microfabrication processes of an upper electrode film in a KNN thin film device, the inventors have found that when dry-etching an upper electrode film, the intensity of Na emission in an ion plasma generated by the etching changes with the progress of the etching and that the upper electrode film etching can be determined as completed when the rate of change of the emission intensity falls below a predetermined threshold. The present invention was made based on these findings.

Preferred embodiments of the present invention will be described below with reference to the accompanying drawings. However, the invention is not limited to the specific embodiments described below, but various combinations and modifications are possible without departing from the spirit and scope of the invention.

FIGS. 1(a)-1(f) are a schematic illustration showing an enlarged cross sectional view of manufacturing steps of a ferroelectric thin film device according to the invention. While a cleaning step and a drying step are not described below, it is preferable that these steps are performed as needed.

First, a substrate 11 is prepared. A material of the substrate 11 is not particularly limited, and may be properly selected based on applications of the ferroelectric thin film device. For example, silicon (Si), SOI (Silicon on Insulator), quartz glass, gallium arsenide (GaAs), gallium nitride (GaN), sapphire ($Al_2O_3$), magnesium oxide (MgO), zinc oxide (ZnO), and strontium titanate ($SrTiO_3$) may be used. From the view point of cost, using Si substrates is preferable among these materials. When an electrically conductive material is used as the substrate 11, its surface is preferably covered with an electrical insulating film (e.g. an oxide film). There is no particular limitation on a method of forming the oxide film. For example, thermal oxidation and chemical vapor deposition (CVD) are suitable.

Lower Electrode Film Formation Step

At this lower electrode film formation step, a lower electrode film 12 is formed on the substrate 11 (see FIG. 1(a)). There is no particular limitation on a material of the lower electrode film 12; however, platinum (Pt) and an alloy mainly containing platinum are preferable. There is no particular limitation on a method for forming the lower electrode film 12 and a thickness thereof. For example, the lower electrode film 12 with a thickness of approximately 100 to 300 nm is formed preferably by a physical vaper deposition method such as sputtering, thermal evaporation, and electron beam evaporation.

The lower electrode film 12 is preferably formed via an adhesive layer (e.g. a titanium (Ti) layer with a thickness of 1 to 5 nm) to enhance the adhesion between the substrate 11 and the lower electrode film 12. Also, the lower electrode film 12 preferably has an arithmetic mean surface roughness (Ra) of 0.86 nm or less so that a later-formed niobate-system ferroelectric thin film 13 can exhibit sufficient ferroelectric properties.

Ferroelectric Thin Film Formation Step

At this ferroelectric thin film formation step, the ferroelectric thin film 13 is formed on the lower electrode film 12 (see FIG. 1(*a*)). KNN (($K_{1-x}Na_x$)$NbO_3$, $0.4 \leq x \leq 0.7$) is preferable as a material of the ferroelectric thin film 13. Preferably, in order to achieve sufficient ferroelectric performance, a crystal system of the ferroelectric thin film 13 is a pseudo cubic system or a tetragonal system, and a (001) crystal plane is preferentially oriented parallel to a thin film surface.

There is no particular limitation on the method for forming the ferroelectric thin film 13 (KNN thin film) as long as a desired KNN thin film is obtained. Preferable methods include sputtering using a sintered body target having a desired chemical composition, electron beam evaporation, and pulsed laser deposition because these methods allow orientation control of the KNN crystal as well as being excellent in terms of chemical composition control of the KNN crystal.

The KNN thin film 13 may contain one or more selected from lithium (Li), tantalum (Ta), antimony (Sb), calcium (Ca), copper (Cu), barium (Ba) and Ti in a total amount of 5 atomic percent or less.

Upper Electrode Formation Step

In this step, an upper electrode film 14 is formed on the ferroelectric thin film 13 (see FIG. 1(*b*)). Preferable materials for the upper electrode film 14 include one selected from Pt, Pd, Ru, Rh, Ir, Au, Al, and an alloy mainly containing one of them. There is no particular limitation on a method for forming the upper electrode film 14 and a thickness thereof. For example, the upper electrode film 14 with a thickness of approximately 100 to 300 nm is formed preferably by a physical vaper deposition method such as sputtering, thermal evaporation, and electron beam evaporation. By the processes described above, a ferroelectric thin film laminated substrate 10 can be obtained.

The upper electrode film 14 is preferably formed via an adhesive layer (e.g. one selected from a nickel (Ni) layer, a cobalt (Co) layer, a tungsten (W) layer and a molybdenum (Mo) layer, each having a thickness of 2 to 30 nm) to enhance the adhesion between the ferroelectric thin film 13 and the upper electrode 14.

Etch Mask Formation Step

In this step, on the upper electrode film 14, an etch mask 15 against the dry etching described below (reactive ion etching) is formed. There is no particular limitation on the etch mask 15 as long as it can be used for reactive ion etching. Preferred examples include a resist mask formed by a photolithographic process (see FIG. 1(*c*)).

Upper Electrode Film Etching Step

In this step, the upper electrode film 14 is etched into a pattern defined by the etch mask 15 to form an upper electrode 14' (see FIG. 1(*d*)). The upper electrode film 14 may be preferably etched by a reactive ion etching (RIE) process. Also, as the RIE process gas, Ar may be used alone or in combination with a fluorine-based reaction gas. Use of Ar in combination with a fluorine-based reaction gas can increase the etching rate. Preferred examples of the fluorine-based reaction gas include trifluoromethane ($CHF_3$), ethane hexafluoride ($C_2F_6$), methane tetrafluoride ($CF_4$), sulfur hexafluoride ($SF_6$), and perfluorocyclobutane ($C_4F_8$). After the etching process is completed, the etch mask 15 is removed.

The most striking feature of the method for manufacturing a ferroelectric thin film device according to the embodiment of the present invention lies in that in the above-described upper electrode film etching step, the Na emission intensity in an ion plasma generated by RIE is measured to calculate the rate of change of the Na emission intensity with respect to time, and when the rate of change falls below a predetermined threshold, the etching of the upper electrode film 14 is determined as complete. This feature will be described in more detail hereinafter.

(1) Examination of Upper Electrode Film Etching

An examination to determine an index for estimating completion of etching of the upper electrode film 14 was conducted. First, test pieces to be subjected to the upper electrode film etching test were prepared. As the substrate 11, a Si substrate with a thermally oxidized film was used. On the Si substrate, a Pt film having a thickness of 200 nm was formed as the lower electrode film 12. On the Pt film, a KNN (($K_{0.35}Na_{0.65}$)$NbO_3$) thin film having a thickness of 2 μm was formed as the ferroelectric thin film 13. On the KNN film, a Pt film having a thickness of 200 nm was formed as the upper electrode film 14.

The upper electrode film 14 (Pt film) of each test piece as prepared above was subjected to a dry-etching process using a reactive ion etcher (EIS-700, available from ELIONIX INC.), and the Na emission intensity in an ion plasma generated during the etching process was measured using a spectrometer (USB2000, available from Ocean Optics, Inc.). The RIE condition was as follows: antenna power of 500 W; RF bias power of 200 W; Ar gas flow of 30 sccm; and gas pressure of 1.9 Pa.

Figure 2:
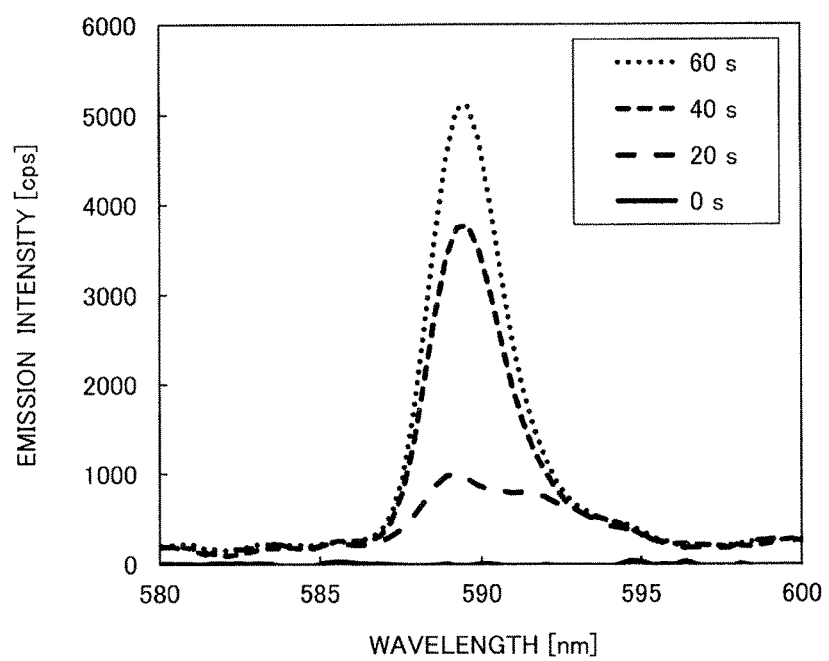
FIG. 2 is a graph showing a relationship between Na emission wavelength and a measured Na emission intensity.

FIG. 2 is a graph showing a relationship between Na emission wavelength and the Na emission intensity measured above. As shown in FIG. 2, an Na emission spectrum having a peak at a wavelength of approximately 589 nm within a wavelength range between approximately 586 to 592 nm was detected. Also, it was observed that the Na emission spectrum grew in emission intensity with the progression of the etching time.

Figure 3:
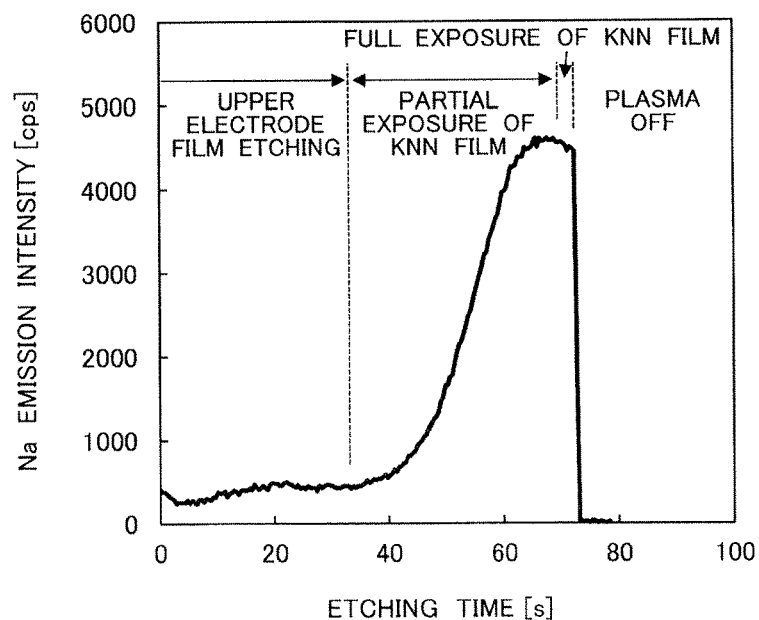
FIG. 3 is a graph showing a relationship between etching time and an emission intensity with the Na emission spectrum at 589 nm.

Furthermore, the test pieces were subjected to the etching for 0 second (i.e. in the original state), 20 seconds, 40 seconds, 60 seconds, or 70 seconds, and then the etching state (the progress of etching) was examined by observing the microstructure of each test piece, having been subjected to the etching process for a different time, with a scanning electron microscopy (SEM). FIG. 3 is a graph showing a relationship between the etching time and the emission intensity with the Na emission spectrum at 589 nm. Results of the etching state by the microstructure observation are also described in FIG. 3. As shown in FIG. 3, within approximately 35 seconds after the start of the etching, only the upper electrode film 14 was etched. From approximately 35 seconds to 68 seconds after the start, the KNN thin film was partly exposed (i.e. part of the upper electrode film 14 remained unetched). After approximately 68 seconds and on, the etching of the upper electrode film 14 was completed.

Based on the above experimental results, the inventors investigated variously to control the etching of the upper electrode film 14 with preventing from overetching by measuring the Na emission intensity during etching, similar to the graph shown in FIG. 3. Unfortunately, however, the inventors found it difficult to determine when the etching of the upper electrode film 14 was completed with measurements similar to those shown in the graph of FIG. 3, and therefore the inventors concluded that these measurements were not suitable for the etching control of the upper electrode film 14. Then, the inventors focused on a rate of change of the Na emission intensity in the graph of FIG. 3.

Figure 4:
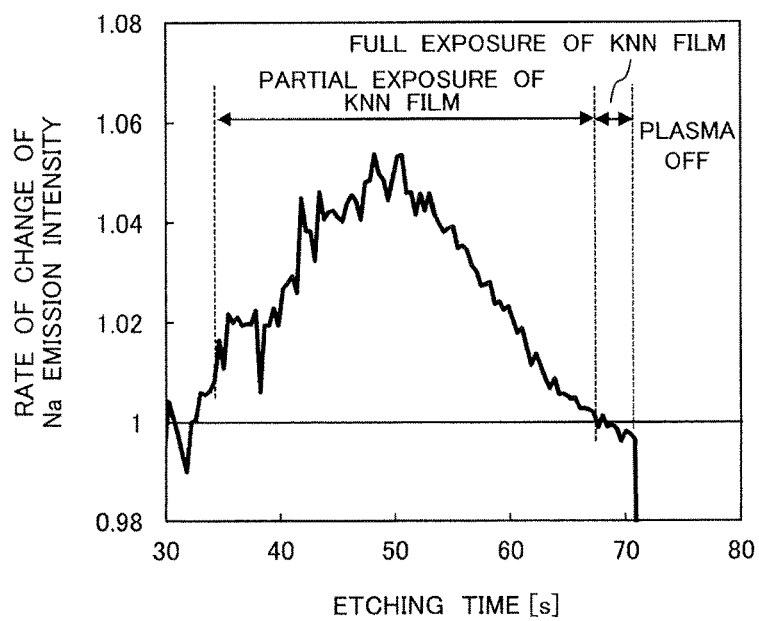
FIG. 4 is a graph showing a relationship between the etching time and a rate of change of emission intensity with the Na emission spectrum at 589 nm.

FIG. 4 is a graph showing a relationship between the etching time and the rate of change of emission intensity with the Na emission spectrum at 589 nm. As shown in FIG. 4, it is revealed that when the rate of change of Na emission intensity exceeds 1.01, the KNN thin film starts to be partly exposed, and when the rate of change of Na emission intensity subsequently falls below 1.0, the etching of the upper electrode film 14 is completed. In other words, it is found that the etching of the upper electrode film 14 can be determined as completed when the rate of change of Na emission intensity measured/calculated with respect to the etching time falls below 1.0 after it exceeds 1.01 once.

The rate of change of the Na emission intensity is preferably calculated as an average rate of change during a period of 0.5 seconds or more and 2 seconds or less. When this period is less than 0.5 seconds, the smoothing of variations and fluctuations of the detected Na emission intensity becomes insufficient, making it difficult to correctly determine when the KNN thin film starts to be partly exposed (i.e. the time when the rate of change exceeds 1.01) and when the etching of the upper electrode film 14 is completed (i.e. the time when the rate of change falls below 1.0). By contrast, when the period is more than 2 seconds, the determination of when the etching of the upper electrode film 14 is completed (i.e. the time when the rate of change falls below 1.0) is delayed, resulting in overetching. In FIG. 4, the rate of change is a value calculated as an average rate of change during a period of 1 second.

Ferroelectric Thin Film Etching Step

Figure 1E:
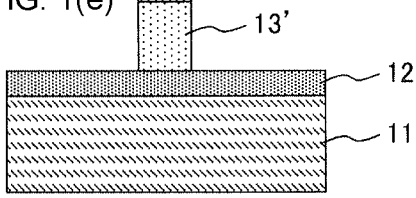

In this step, the ferroelectric thin film 13 (KNN thin film) is subjected to an etching process and shaped into a desired micro-pattern (see FIG. 1(e)). In the present invention, there is no particular limitation on the etching method of the KNN thin film, and any conventional method (e.g. a dry-etching process and a wet-etching process) may be used. Also, the ferroelectric thin film etching step may be performed before the upper electrode film formation step or after the upper electrode film etching step. By this step, a ferroelectric thin film pattern 13' having a desired pattern can be formed (see FIG. 1(e)).

Dicing Step

Figure 1F:
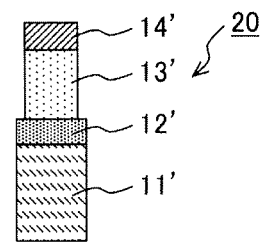

At this dicing step, the substrate with the patterned ferroelectric thin film 13' and the upper electrode 14', each having a desired pattern, is diced into a chip of a ferroelectric thin film device 20 (see FIG. 1(f)). Meanwhile, the reference numeral 11' designates the diced substrate of the chip 20, and numeral 12' designates the lower electrode in the chip 20. Thus, the formation of the ferroelectric thin film device chip 20 having thereon a desired fine pattern of the ferroelectric thin film is completed.

EXAMPLES

The present invention will be described more specifically below by way of examples. However, the invention is not limited to the specific examples below.

Fabrication of Ferroelectric Thin Film-on-Substrate

The KNN thin film-on-substrate 10 was fabricated according to the manufacturing steps illustrated in FIGS. 1(a)-1(f). A 4-inch (100) Si wafer with thermal oxide film (Si wafer thickness of 0.525 mm; oxide film thickness of 200 nm; and surface roughness Ra of wafer of 0.86 nm) was used as the substrate 11.

In the film formation steps below, the thickness of each layer was controlled by controlling the film formation time based on the film formation rate determined in advance. Also, the thickness measurement for calculation of each film formation rate was conducted by the X-ray reflectivity technique using an X-ray diffractometer (X'Pert PRO MRD, available from PANalytical B. V., Spectris Co., Ltd.).

First, a 2.2-nm thick Ti layer was formed on the Si substrate 11 by RF magnetron sputtering as a lower electrode adhesive layer to enhance adhesion between the substrate 11 and the lower electrode film 12. Subsequently, the lower electrode film 12 was formed by forming a 205-nm thick Pt layer on the Ti adhesive layer by RF magnetron sputtering (see FIG. 1(a)). The sputtering conditions for the Ti adhesive layer and the Pt lower electrode film 12 were as follows: targets of pure Ti (for the Ti adhesive layer) and pure Pt (for the Pt electrode film); substrate temperature of 250° C.; discharge power of 200 W; sputtering gas of Ar; and gas pressure of 2.5 Pa. The sputtering was carried out using a RF sputtering machine (SH-350-T10, available from ULVAC, Inc.) (the same machine was used in all the remaining sputtering processes described below). It was checked that the measured arithmetic mean surface roughness Ra of the thus formed lower electrode film 12 was 0.86 nm or less.

After the formation of the Pt lower electrode film 12, the ferroelectric thin film 13 was formed by forming a 1.9-μm thick KNN (($K_{0.35}Na_{0.65}$)$NbO_3$) thin film on the lower electrode film 12 by RF magnetron sputtering (see FIG. 1(a)). The sputtering condition for the KNN thin film 13 was as follows: target of sintered ($K_{0.35}Na_{0.65}$)$NbO_3$; substrate temperature of 400 to 600° C.; discharge power of 700 to 800 W; sputtering gas of $O_2$/Ar mixture ($O_2$/Ar ratio=0.005); and gas pressure of 0.3 to 1.3 Pa.

Next, a 3-nm thick Ni layer was formed on the ferroelectric thin film 13 by electron beam evaporation as an upper electrode adhesive layer to enhance adhesion between the ferroelectric thin film 13 and the upper electrode film 14. Subsequently, the upper electrode film 14 was formed by forming a 200-nm thick Pt layer on the Ni adhesive layer by electron beam evaporation (see FIG. 1(b)). The electron beam evaporation was carried out using an electron beam evaporation machine (EX-400-C08, available from ULVAC, Inc.).

Evaluation of Crystal Structure of KNN Thin Film

Normally, perovskite KNN crystals have a tetragonal structure in which the c-axis is longer than the a-axis (c/a>1). That is, when formed KNN crystals satisfy the crystalline condition of "c/a>1", the crystals are more stable and the crystallinity thereof is high. When an electric field is applied along the c-axis of a perovskite-type ferroelectric crystal with a small initial strain, a larger polarization (and thus a higher gain in piezoelectric or ferroelectric performance) is obtained.

Meanwhile, unlike bulk crystals, thin-film crystals formed on a substrate are prone to distortion caused by the influence of the substrate or the underlayer. Specifically, the KNN thin film formed on a substrate may have a pseudo cubic crystal system with "c/a≤1" (herein meaning "a system closer to a cubic crystal system than to a proper tetragonal crystal system") or a tetragonal crystal system with "c/a>1" (herein meaning "a system closer to a proper tetragonal crystal system"). Therefore, the crystal system of the KNN thin film formed above was evaluated by X-ray diffraction (XRD). The result showed that a KNN thin film-on-substrate, in which the KNN thin film having a tetragonal system with "c/a>1" was mainly formed, was obtained.

Fabrication of Ferroelectric Thin Film Device

Fabrication of Reference Sample

A part of the KNN thin film laminated substrate described above was subjected directly to the dicing step, without being subjected to the upper electrode film etching step, to fabricate a test piece (20 mm×20 mm). This test piece, completely unaffected by the upper electrode film etching step and the ferroelectric thin film etching step, was prepared to serve as a reference sample for evaluation of ferroelectricity of the formed KNN thin film.

Fabrication of Example 1

The etch mask 15 was formed by applying, exposing, and developing a photoresist (OFPR-800, available from TOKYO OHKA KOGYO CO., LTD.) on the other part of the KNN thin film laminated substrate described above (see FIG. 1(c)). Subsequently, a part of the upper electrode film 14 was etched according to the upper electrode film etching step of the embodiment of the present invention using a reactive ion etcher (EIS-700, available from ELIONIX INC.) to form the upper electrode 14' having a desired pattern (see FIG. 1(d)). The RIE condition was as follows: antenna power of 500 W; RF bias power of 200 W; Ar gas flow of 30 sccm; and gas pressure of 1.9 Pa. The Na emission intensity was measured using a spectrometer (USB 2000, available from Ocean Optics, Inc.). The rate of change of Na emission intensity was calculated as an average rate of change during a period of 1 second.

Subsequently, to the etched region of the KNN thin film laminated substrate, the dicing step was performed to fabricate a test piece (20 mm×20 mm) of Example 1. Meanwhile, the ferroelectric thin film etching step was not performed so as to avoid any influence of the ferroelectric thin film etching step on the ferroelectricity of the KNN thin film.

Fabrication of Comparative Example 1

To the other part of the upper electrode film 14, the upper electrode film etching step was performed in the same manner as Example 1 except that the measurement of the Na emission intensity and the calculation of the rate of change of Na emission intensity were not conducted. The upper electrode film etching step was performed such that the etching time was controlled based on a predetermined etching rate.

Subsequently, the dicing step was performed to fabricate a test piece (20 mm×20 mm) of Comparative Example 1. Also with Comparative Example 1, the ferroelectric thin film etching step was not performed so as to avoid any influence of the ferroelectric thin film etching step on the ferroelectricity of the KNN thin film.

Figure 5:
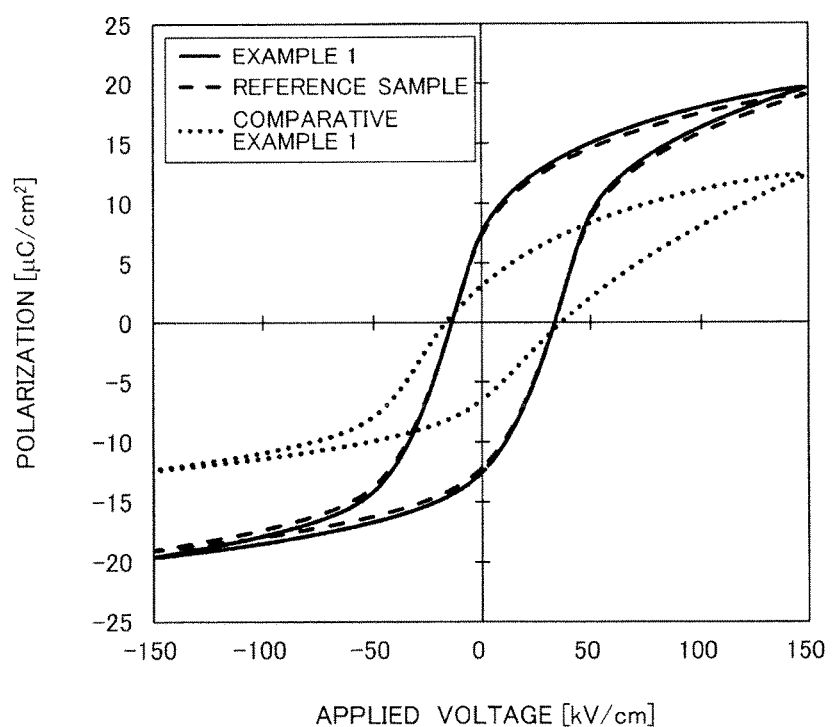
FIG. 5 is a graph showing exemplary relationships between polarization value and applied voltage in the KNN thin film devices of reference sample, Example 1 and Comparative Example 1.

The obtained KNN thin film devices (reference sample, Example 1 and Comparative Example 1) were measured for the polarization using a ferroelectric characteristics analyzer. FIG. 5 is a graph showing exemplary relationships between the polarization value and the applied voltage in the KNN thin film devices of reference sample, Example 1 and Comparative Example 1.

As shown in FIG. 5, the polarization (the hysteresis loop of the polarization value) of Example 1, fabricated in accordance with the embodiment of the present invention, almost completely matches that of the reference sample. This indicates that the ferroelectricity of Example 1 was not affected by the upper electrode film etching step. In other words, it is demonstrated that the upper electrode film etching step according to the embodiment of the present invention is capable of finely shaping an upper electrode film highly accurately and efficiently without deteriorating ferroelectricity.

By contrast, it was found that the polarization (the hysteresis loop of the polarization value) of Comparative Example 1 was more deteriorated than those of the reference sample and Example 1. This can be attributed to overetching of the KNN thin film layer due to the difficulty of controlling the timing of finishing the upper electrode film etching by controlling the etching time based on a predetermined etching rate.

The above embodiments and examples of the invention as well as the appended claims and figures show multiple characterizing features of the invention in specific combinations. The skilled person will easily be able to consider further combinations or sub-combinations of these features in order to adapt the invention as defined in the claims to his specific needs.

LEGEND

10 . . . ferroelectric thin film laminated substrate;
11 . . . substrate;
11' . . . diced substrate of chip;
12 . . . lower electrode film;
12' . . . lower electrode;
13 . . . ferroelectric thin film;
13' . . . patterned ferroelectric thin film;
14 . . . upper electrode film;
14' . . . upper electrode;
15 . . . etch mask; and
20 . . . ferroelectric thin film device.

The invention claimed is:

1. A method for manufacturing a ferroelectric thin film device, the method comprising:
a lower electrode film formation step of forming a lower electrode film on a substrate;

a ferroelectric thin film formation step of forming a ferroelectric thin film made of a sodium potassium niobate $(K_{1-x}Na_x)NbO_3$, $0.4 \leq x \leq 0.7$, on the lower electrode film;

an upper electrode film formation step of forming an upper electrode film on the ferroelectric thin film; and an upper electrode film etching step of shaping the upper electrode film into a desired micro-pattern by performing a reactive ion etching process on the upper electrode film, wherein the upper electrode film etching step is a step of calculating a rate of change of sodium emission intensity in an ion plasma generated by the reactive ion etching process and determining that the etching process is completed when the rate of change falls below a predetermined threshold, wherein the predetermined threshold is 1.0 after the rate of change of sodium emission intensity exceeds 1.01 once, and wherein the rate of change of sodium emission intensity is an average rate of change during a period of 0.5 seconds or more and 2 seconds or less.

2. The method for manufacturing a ferroelectric thin film device according to claim 1, wherein
the sodium emission is a sodium emission spectrum having a wavelength of 586 nm or more and 592 nm or less.

3. The method for manufacturing a ferroelectric thin film device according to claim 1, wherein
in the reactive ion etching process, argon is used alone or in combination with a fluorine-based reaction gas as a process gas.

4. The method for manufacturing a ferroelectric thin film device according to claim 1, wherein
the upper electrode film comprises one selected from platinum, palladium, ruthenium, rhodium, iridium, gold, and aluminum.

5. The method for manufacturing a ferroelectric thin film device according to claim 1, the method further comprising a dicing step of cutting out a chip-shaped ferroelectric thin film device from the substrate provided with the ferroelectric thin film having the upper electrode film formed on the ferroelectric thin film.

6. The method for manufacturing a ferroelectric thin film device according to claim 1, the method further comprising a ferroelectric thin film etching step of shaping the ferroelectric thin film into a desired micro-pattern by performing an etching process on the ferroelectric thin film.

7. The method for manufacturing a ferroelectric thin film device according to claim 1, wherein
the ferroelectric thin film has a pseudo cubic system or a tetragonal system and is formed by sputtering such that the film has a main surface with a (001) crystal plane preferential orientation.

8. The method for manufacturing a ferroelectric thin film device according to claim 1, wherein
the substrate is a silicon substrate having a thermally oxidized film on its surface.

* * * * *